(12) United States Patent
Nakagawa

(10) Patent No.: US 12,174,230 B2
(45) Date of Patent: Dec. 24, 2024

(54) ELECTRICITY LEAKAGE DETECTION DEVICE AND VEHICLE POWER SUPPLY SYSTEM

(71) Applicant: SANYO Electric Co., Ltd., Osaka (JP)

(72) Inventor: Yousuke Nakagawa, Hyogo (JP)

(73) Assignee: SANYO Electric Co., Ltd., Osaka (JP)

(*) Notice: Subject to any disclaimer, the term of this patent is extended or adjusted under 35 U.S.C. 154(b) by 135 days.

(21) Appl. No.: 17/906,877

(22) PCT Filed: Nov. 19, 2020

(86) PCT No.: PCT/JP2020/043109
§ 371 (c)(1),
(2) Date: Sep. 21, 2022

(87) PCT Pub. No.: WO2021/199490
PCT Pub. Date: Oct. 7, 2021

(65) Prior Publication Data
US 2023/0152359 A1    May 18, 2023

(30) Foreign Application Priority Data

Mar. 30, 2020  (JP) .................................. 2020-059669

(51) Int. Cl.
*G01R 27/18*    (2006.01)
*B60L 58/10*    (2019.01)
(Continued)

(52) U.S. Cl.
CPC .............. *G01R 27/18* (2013.01); *B60L 58/10* (2019.02)

(58) Field of Classification Search
CPC ........ G01R 27/18; G01R 27/31; G01R 31/00; G01R 31/02; G01R 31/14
See application file for complete search history.

(56) References Cited

U.S. PATENT DOCUMENTS

| 2004/0130326 A1 | 7/2004 | Yamamoto |
| 2011/0012606 A1 | 1/2011 | Kawamura |

(Continued)

FOREIGN PATENT DOCUMENTS

| EP | 3929021 A1 | 12/2021 |
| EP | 3992011 A1 | 5/2022 |

(Continued)

OTHER PUBLICATIONS

Extended (Supplementary)European Search Report (EESR) dated Aug. 24, 2023, issued in counterpart EP Application No. 20928495.9. (8 pages).

(Continued)

*Primary Examiner* — Neel D Shah
(74) *Attorney, Agent, or Firm* — WHDA, LLP

(57) ABSTRACT

In leakage detecting device (10) that detects an electric leakage from a high-voltage unit in which power storage unit (20) and a load are connected by a power supply line in a state of being insulated from an earth, Y capacitor (CY) is connected between the earth and a current path between power storage unit (20) and the load. Drive unit (11) of leakage detecting device (10) outputs a rectangular wave voltage to the current path between power storage unit (20) and the load via driving coupling capacitor (Cd1) to charge or discharge Y capacitor (CY). Leakage detector (12) determines presence or absence of the electric leakage between the current path and the earth according to a time transition in which the voltage at the measurement point of the current path changed according to charging or discharging of Y capacitor (CY) converges to an original voltage.

12 Claims, 7 Drawing Sheets

(51) Int. Cl.
 *G01R 31/00* (2006.01)
 *G01R 31/14* (2006.01)

(56) References Cited

U.S. PATENT DOCUMENTS

2013/0245869 A1    9/2013  Nishida et al.
2018/0224494 A1*   8/2018  Iwanabe ................ G01R 31/64

FOREIGN PATENT DOCUMENTS

| EP | 3992012 A1 | 5/2022 | |
| EP | 4068544 A1 | 10/2022 | |
| EP | 4068545 A1 | 10/2022 | |
| JP | 8-070503 | 3/1996 | |
| JP | 2933490 B | 8/1999 | |
| JP | 2004-286523 A | 10/2004 | |
| JP | 2010-249766 A | 11/2010 | |
| JP | 2010249766 | * 11/2010 | ............ G01R 31/02 |
| JP | 2011-021990 | 2/2011 | |

OTHER PUBLICATIONS

International Search Report of PCT application No. PCT/JP2020/043109 dated Feb. 9, 2021.

\* cited by examiner

Power supply system 5

Power supply system 5

(a)

(b)

Power supply system 5

Power supply system 5

ELECTRICITY LEAKAGE DETECTION DEVICE AND VEHICLE POWER SUPPLY SYSTEM

TECHNICAL FIELD

The present disclosure relates to a leakage detecting device and a vehicle power supply system that detect an electric leakage from a load insulated from the earth.

BACKGROUND ART

Hybrid vehicles (HV), plug-in hybrid vehicles (PHV), and electric vehicles (EV) have become widespread in recent years. These electric vehicles are equipped with auxiliary batteries (which are, in general, lead batteries with power output of 12 V) and with drive batteries for high-voltage use (traction batteries), which are separated from the auxiliary batteries. To prevent an electric shock accident, a high-voltage circuit including a drive battery for high voltage use, an inverter, and a running motor is insulated from the body (chassis earth) of a vehicle.

A Y capacitor is inserted between the positive power supply line and the chassis earth of the high-voltage circuit on the vehicle and between the negative power supply line and the chassis earth of the high-voltage circuit on the vehicle, so that the power source supplied from the high-voltage driving battery to the load on the vehicle is stabilized. A leakage detecting device is incorporated in a vehicle to monitor insulation resistance between the high-voltage circuit and the chassis earth and detect a leakage.

A leakage detecting device of an AC type applies a pulse voltage to a positive-electrode terminal or a negative-electrode terminal of the drive battery via a resistance and a coupling capacitor, and measures a voltage at a node between the resistance and the coupling capacitor, thereby detecting the presence or absence of a leakage. When an earth fault occurs, the impedance at the measurement point decreases, and the voltage at the measurement point decreases. Therefore, when the voltage at the measurement point is less than or equal to a threshold, it can be determined that an electrical leakage has occurred (see, for example, PTL 1).

CITATION LIST

Patent Literature

PTL 1: Unexamined Japanese Patent Publication No. H08-70503

SUMMARY OF THE INVENTION

Technical Problem

In this method, as the capacitance of the Y capacitor increases, the measurement accuracy of the insulation resistance connected in parallel with the Y capacitor decreases. When the capacitance of the Y capacitor increases, the impedance of the Y capacitor decreases, so that the influence of the fluctuation of the Y capacitor on the calculated value of the insulation resistance increases.

In order to maintain the measurement accuracy of the insulation resistance even when the capacitance of the Y capacitor is large, it is conceivable to reduce the driving frequency of the applied pulse. In this case, the impedance of the coupling capacitor increases, and the influence of the error of the coupling capacitor on the calculated value of the insulation resistance increases. In order to reduce the influence of the error of the coupling capacitor, it is conceivable to increase the capacitance of the coupling capacitor. Since the coupling capacitor is a capacitor that connects the high voltage unit and the low voltage unit, a capacitor with a high withstand voltage is required. When a capacitor having a high capacity and a high withstand voltage is used, the cost increases.

The present disclosure has been made in view of such a situation, and an object of the present disclosure is to provide a technique for detecting an electric leakage with high accuracy at low cost even when the capacitance of the Y capacitor is large.

Solution to Problem

In order to solve the above problem, a leakage detecting device according to an aspect of the present disclosure is a leakage detecting device that detects an electric leakage from a high-voltage unit in which a power storage and a load are connected by a power supply line in a state of being insulated from an earth. A Y capacitor is connected between a current path between the power storage unit and the load and the earth. The leakage detecting device includes: a drive unit configured to output a rectangular wave voltage to the current path between the power storage unit and the load via a driving coupling capacitor to charge or discharge the Y capacitor; and a leakage detector configured to determine presence or absence of a leakage between the current path and the earth according to a time transition in which a voltage at a measurement point of the current path changed according to charging or discharging of the Y capacitor converges to an original voltage.

Advantageous Effect of Invention

According to the present disclosure, it is possible to detect an electric leakage with high accuracy at low cost even when the capacitance of the Y capacitor is large.

DESCRIPTION OF EMBODIMENT

First Exemplary Embodiment

Figure 1:
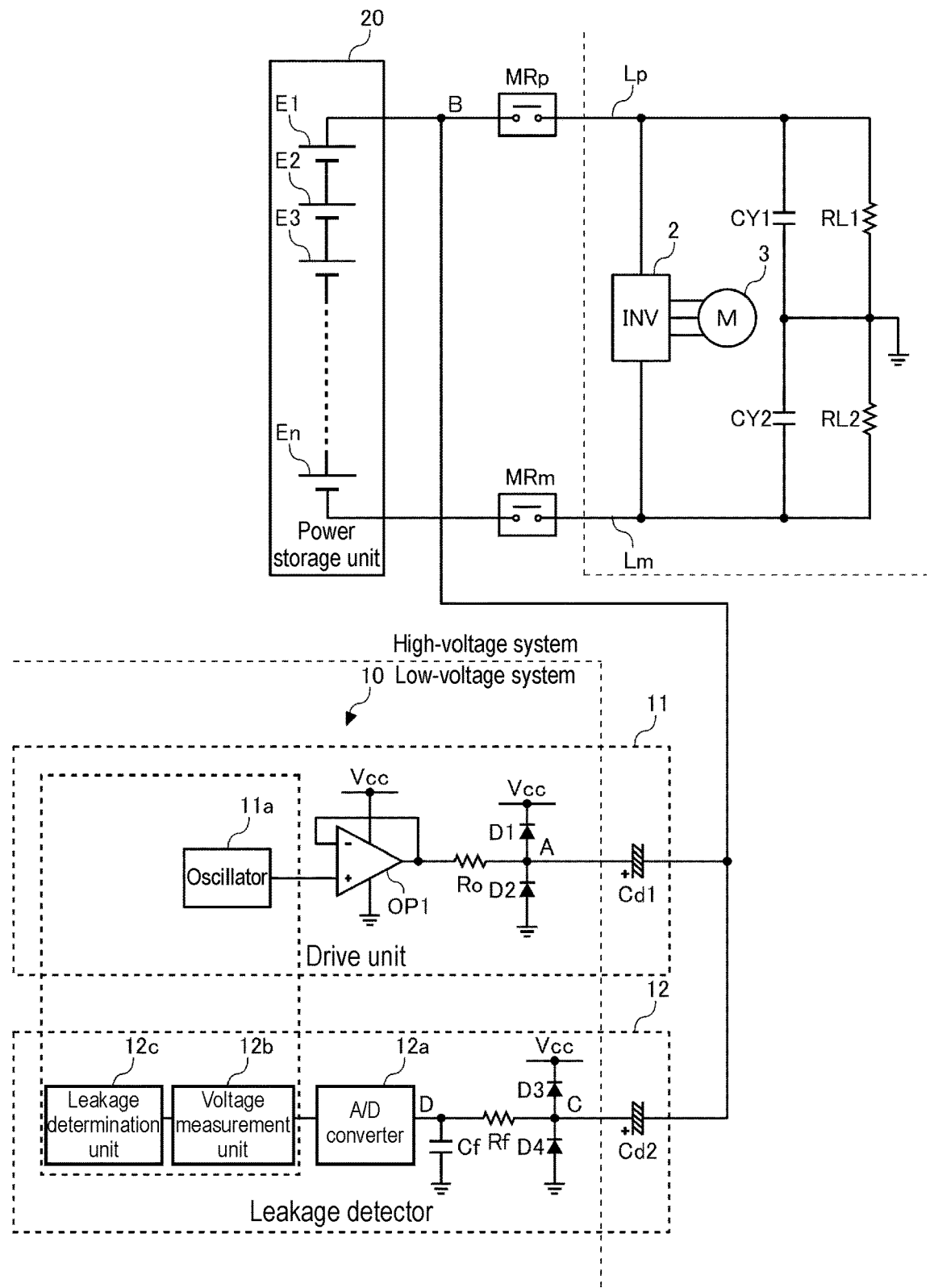
FIG. 1 is a diagram for explaining a configuration of a power supply system including a leakage detecting device according to a first exemplary embodiment.

FIG. 1 is a diagram for explaining a configuration of power supply system 5 including leakage detecting device 10 according to a first exemplary embodiment. Power supply system 5 is incorporated in an electric vehicle. In the electric vehicle, power supply system 5 is provided in separation from an auxiliary battery (which is usually a lead battery with power output of 12 V). Power supply system 5 includes power storage unit 20 of a high-voltage system and leakage detecting device 10 of a low-voltage system. power storage unit 20 includes a plurality of cells E1 to En connected in series. Lithium ion battery cells, nickel metal hydride battery cells, lead battery cells, electric double-layer capacitor cells, lithium ion capacitor cells, or the like can be used as cells E1 to En. Hereinafter, in this specification, it is assumed that lithium ion battery cells (with a nominal voltage ranging from 3.6 V to 3.7 V) are used as cells E1 to En.

The electric vehicle includes inverter 2 and motor 3 as loads for a high-voltage system. The positive electrode of power storage unit 20 is connected to one end of inverter 2 through positive power supply line Lp, and the negative electrode of power storage unit 20 is connected to the other end of inverter 2 through negative power supply line Lm. Positive power supply line Lp is provided with positive-side main relay MRp, and negative power supply line Lm is provided with negative-side main relay MRm. Positive-side main relay MRp and negative-side main relay MRm function as contactors that control electrical connection/disconnection between power storage unit 20 and the loads for a high-voltage system in the electric vehicle. In place of these relays, semiconductor switches with high withstand voltage and insulation performance may be used.

Inverter 2 is a bidirectional inverter connected between power storage unit 20 and motor 3. At the time of power running, inverter 2 converts DC power, which is supplied from power storage unit 20, into AC power and supplies the AC power to motor 3. At the time of regeneration, inverter 2 converts AC power, which is supplied from motor 3, into DC power and supplies the DC power to power storage unit 20. As motor 3, for example, a three-phase AC motor is used. At the time of power running, motor 3 rotates in accordance with AC power supplied from inverter 2. At the time of regeneration, motor 3 converts rotational energy created by deceleration into AC power and supplied the AC power to inverter 2.

power storage unit 20 is incorporated in the electric vehicle such that power storage unit 20 is kept insulated from a chassis earth of the electric vehicle. The auxiliary battery is incorporated in the electric vehicle such that the negative electrode of the auxiliary battery is electrically connected to the chassis earth. Positive power supply line Lp that is closer to inverter 2 than positive-side main relay MRp is connected to the chassis earth via first Y capacitor CY1. In addition, negative power supply line Lm that is closer to inverter 2 than negative-side main relay MRm is connected to the chassis earth via second Y capacitor CY2. First Y capacitor CY1 and second Y capacitor CY2 insulate positive power supply line Lp from the chassis earth and negative power supply line Lm from the chassis earth in terms of direct current, and stabilize the voltages of positive power supply line Lp and negative power supply line Lm. One of first Y capacitor CY1 and second Y capacitor CY2 may be omitted.

When power storage unit 20 is insulated from the chassis earth in an ideal manner, an intermediate potential of power storage unit 20 is kept close to a potential of the chassis earth. For example, when a voltage across both ends of power storage unit 20 is 250 V, a positive electrode potential of power storage unit 20 is kept close to +125 V as a negative electrode potential of the same is kept close to −125 V. When power storage unit 20 for a high-voltage system and the chassis earth are in a state of being electrically connected to each other, a person's touching an exposed conducting part of the electric vehicle is so dangerous that it may give an electric shock to the person. For this reason, it is necessary that the electric vehicle including power storage unit 20 for a high-voltage system be equipped with leakage detecting device 10 to monitor an insulation state between a current path of power storage unit 20, which is connected to vehicle loads for a high-voltage system, and the chassis earth. In FIG. 1, the insulation state between positive power supply line Lp and the chassis earth is referred to as first leakage resistor RL1, and the insulation state between negative power supply line Lm and the chassis earth is referred to as second leakage resistor RL2.

leakage detecting device 10 includes drive unit 11 and leakage detector 12. drive unit 11 includes driving coupling capacitor Cd1, output resistor Ro, operational amplifier OP1, oscillator 11a, first protection diode D1, and second protection diode D2.

One end of driving coupling capacitor Cd1 is connected to a current path between power storage unit 20 and the vehicle load. In the example illustrated in FIG. 1, one end of driving coupling capacitor Cd1 is connected to positive power supply line Lp. Note that one end of driving coupling capacitor Cd1 may be connected to any position on the current path. For example, it may be connected to negative power supply line Lm. The other end of driving coupling capacitor Cd1 is connected to output resistor Ro. First protection diode D1 is connected between the wiring between the other end of driving coupling capacitor Cd1 and output resistor Ro and power supply potential Vcc of a low-voltage system, and second protection diode D2 is connected between the wiring and the ground potential.

Oscillator 11a includes a multi-vibrator or a local oscillator, and generates a rectangular wave with a preset frequency. The rectangular wave voltage generated by oscillator 11a is input to a non-inverting input terminal of operational amplifier OP1. An output terminal of operational amplifier OP1 is connected to output resistor Ro. An inverting input terminal of operational amplifier OP1 is connected to the output terminal of the same. Operational amplifier OP1 functions as a voltage follower that performs only impedance conversion with an amplification factor of 1.

Oscillator 11a outputs a rectangular wave voltage to point A via operational amplifier OP1 and output resistor Ro. The rectangular wave voltage output to point A is applied to point B on the current path between power storage unit 20 and the vehicle load via driving coupling capacitor Cd1. As a result, charges are charged in first Y capacitor CY1 and second Y capacitor CY2, or charges are discharged from first Y capacitor CY1 and second Y capacitor CY2.

Leakage detector 12 includes measurement coupling capacitor Cd2, resistor Rf, capacitor Cf, A/D converter 12a, voltage measurement unit 12b, leakage determination unit 12c, third protection diode D3, and fourth protection diode D4.

One end of measurement coupling capacitor Cd2 is connected to a current path between power storage unit 20 and the vehicle load. In FIG. 1, one end of measurement coupling capacitor Cd2 is connected to point B on the current path to which driving coupling capacitor Cd1 is connected, but may be connected to any position on the current path. The other end of measurement coupling capacitor Cd2 is connected to a low-pass filter including resistor Rf and capacitor Cf Third protection diode D3 is connected between the wiring between the other end of measurement coupling capacitor Cd2 and resistor Rf and power supply potential Vcc of a low-voltage system, and fourth protection diode D4 is connected between the wiring and the ground potential.

The low-pass filter removes noise from the voltage at point C input from measurement coupling capacitor Cd2, and outputs the voltage at point D from which noise has been removed. A/D converter 12*a* converts the analog voltage at point D input from the low-pass filter into a digital value voltage and outputs the digital value voltage to voltage measurement unit 12*b*. Voltage measurement unit 12*b* measures a voltage of a digital value input from A/D converter 12*a*. leakage determination unit 12*c* determines the presence or absence of an electric leakage between the current path between power storage unit 20 and the vehicle load and the chassis earth based on the voltage measured by voltage measurement unit 12*b*.

In FIG. 1, oscillator 11*a*, voltage measurement unit 12*b*, and leakage determination unit 12*c* may be configured by one IC.

In the first exemplary embodiment, a rectangular wave voltage is applied from drive unit 11 to point B to charge first Y capacitor CY1 and second Y capacitor CY2. The electric leakage is detected based on a voltage time transition (specifically, a voltage change rate) when the electric charges charged in first Y capacitor CY1 and second Y capacitor CY2 are discharged via first leakage resistor RL1 and second leakage resistor RL2.

Figure 2:
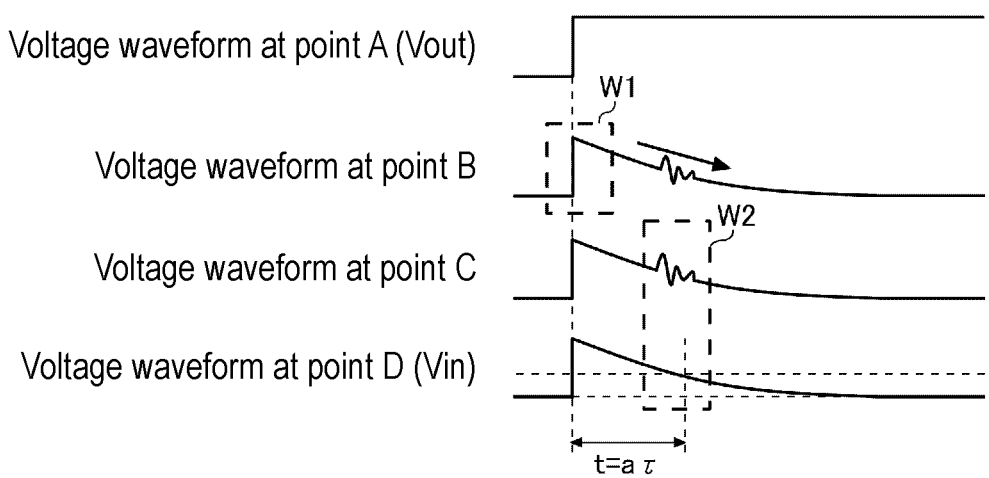
FIG. 2 is a diagram illustrating an example of a voltage waveform at each point at the time of electric leakage detection by the leakage detecting device according to the first exemplary embodiment.

FIG. 2 is a diagram illustrating an example of a voltage waveform at each point at the time of electric leakage detection by leakage detecting device 10 according to the first exemplary embodiment. When the voltage waveform at point A rises, charges are charged in first Y capacitor CY1 and second Y capacitor CY2, and the voltage of B rises due to an increase in the capacitance of first Y capacitor CY1 and second Y capacitor CY2 (see W1). The voltage variation at point B is transmitted to point C via measurement coupling capacitor Cd2. The voltage waveform at point D is obtained by removing noise from the voltage waveform at point C by the low-pass filter (see W2). When viewed from leakage detecting device 10, the voltage at point A is output voltage Vout for driving, and the voltage at point D is input voltage Vin for measurement.

As the charges charged in first Y capacitor CY1 and second Y capacitor CY2 escape through first leakage resistor RL1 and second leakage resistor RL2, the voltage at point B gradually decreases and converges to the original voltage. In the first exemplary embodiment, the leakage resistance value is calculated by measuring the voltage return time at point B.

In the following calculation formula, the parallel resistance value of first leakage resistor RL1 and second leakage resistor RL2 is simply referred to as RL. The parallel capacitance value of first Y capacitor CY1 and second Y capacitor CY2 is simply referred to as CY. The capacitance value of driving coupling capacitor Cd1 is simply referred to as Cd. The time constant τ at point B of the circuit illustrated in FIG. 1 is defined as the following (Formula 1). Input voltage Vin at point D is defined as the following (Formula 2). E is a voltage applied from drive unit 11 to point B.

$$\tau = RL \times (CY + Cd) \quad \text{(Formula 1)}$$

$$Vin = E \times Cd/(Cd + CY) \times e^{-t/\tau} \quad \text{(Formula 2)}$$

Electrical leakage determination unit 12*c* measures time t at which $Vin = E \times Cd/(Cd+CY) \times e^{-a}$. Since a relationship of $t = a\tau = a \times (RL \times CY)$ holds, insulation resistance RL is defined as the following (Formula 3).

$$RL = t/(a \times CY) \quad \text{(Formula 3)}$$

As leakage resistor RL is smaller, the voltage at point D converges to the original voltage in a shorter time. Electrical leakage determination unit 12*c* measures time t at which voltage Vin at point D becomes $E \times Cd/(Cd+CY) \times e^{-a}$, and calculates the value of leakage resistor RL. Electrical leakage determination unit 12*c* compares the calculated value of leakage resistor RL with a resistance threshold, and determines that an electrical leakage has occurred when the calculated value of leakage resistor RL is less than or equal to the resistance threshold. Alternatively, leakage determination unit 12*c* compares the value of voltage Vin at point D measured after the elapse of the set time from the application of driving voltage Vout with the voltage threshold. When the measured value of voltage Vin at point D is less than or equal to the voltage threshold, leakage determination unit 12*c* determines that the electric leakage occurs. The resistance threshold, the setting time, and the voltage threshold are set in advance based on the leakage resistance value for determining leakage.

COMPARATIVE EXAMPLE

Figure 3:
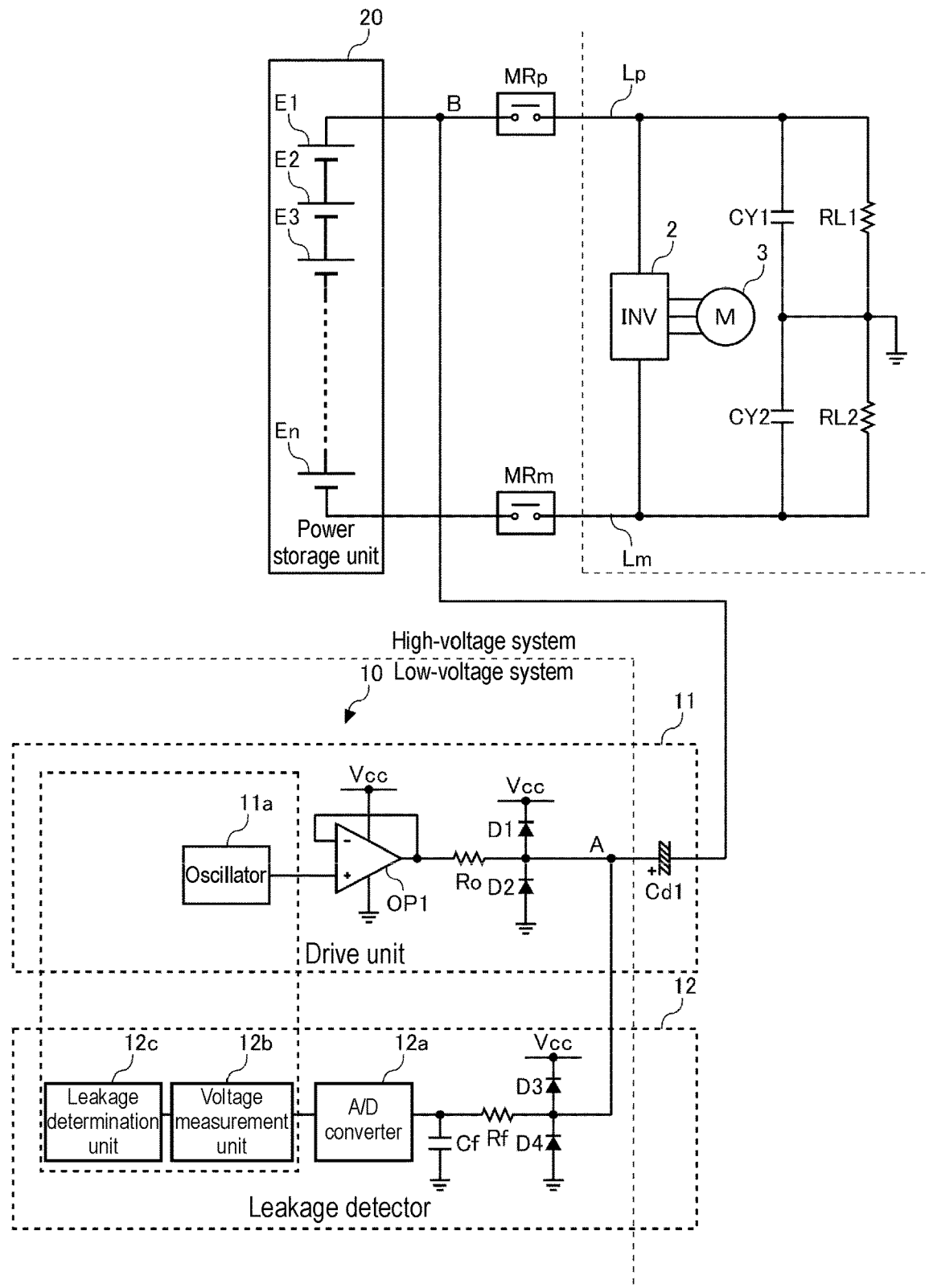
FIG. 3 is a diagram for explaining a configuration of a power supply system including a leakage detecting device according to a comparative example.

FIG. 3 is a diagram for explaining a configuration of power supply system 5 including leakage detecting device 10 according to a comparative example. Hereinafter, differences from leakage detecting device 10 according to the first exemplary embodiment illustrated in FIG. 1 will be described. In the comparative example, measurement coupling capacitor Cd2 is not provided, and leakage detector 12 measures the voltage at point A between driving coupling capacitor Cd1 and output resistor Ro. leakage detector 12 detects an electric leakage from an impedance ratio of output resistor Ro, driving coupling capacitor Cd1, and leakage resistor RL.

Figure 4:
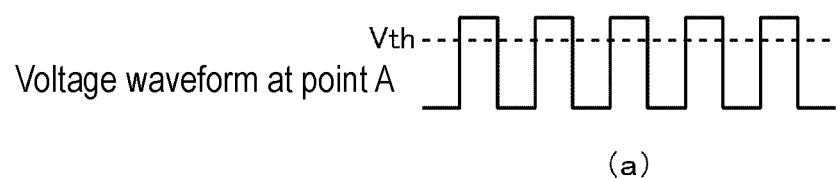
FIG. 4 (a)-(b) is diagram illustrating examples of a voltage waveform at point A before an earth fault occurs and a voltage waveform at point A after the earth fault occurs.
Figure 4:
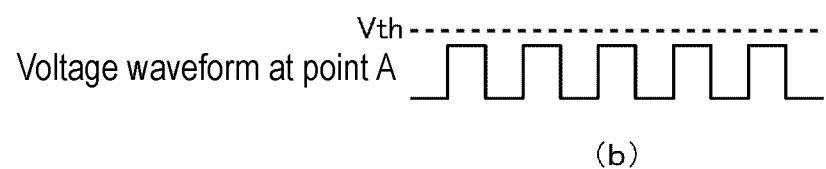

FIGS. 4(*a*) and 4(*b*) are diagrams illustrating an example of a voltage waveform at point A before an earth fault occurs and a voltage waveform at point A after the earth fault occurs. FIG. 4(*a*) illustrates a voltage waveform at point A before an earth fault occurs, and FIG. 4(*b*) illustrates a voltage waveform at point A after the earth fault occurs. When an earth fault occurs, the impedance at point A decreases, and the voltage at point A decreases. When the measured voltage value at point A is less than or equal to the voltage threshold Vth, leakage determination unit 12*c* determines that the electric leakage occurs.

However, in practice, Y capacitor CY is connected in parallel with leakage resistor RL. When the capacitance of Y capacitor CY is large (=the impedance is small), the degree of influence of the change in leakage resistor RL on the combined impedance becomes small. This makes it difficult to detect leakage resistor RL with high accuracy.

In order to maintain the detection accuracy of insulation resistance RL even when the capacitance of the Y capacitor is large, it is conceivable to reduce the frequency of the driving voltage. In that case, as described above, it is necessary to use a capacitor having a high capacity and a high withstand voltage for driving coupling capacitor Cd1, and the cost increases.

In this regard, in the first exemplary embodiment, the capacitance of driving coupling capacitor Cd1 does not affect the detection accuracy of leakage resistor RL as shown in (Formula 3) above. Therefore, even when the capacitance of Y capacitor CY is large, the frequency of the driving voltage can be reduced without using high-spec driving coupling capacitor Cd1. As described above, according to the first exemplary embodiment, even when the capacitance of Y capacitor CY is large, the electric leakage can be detected with high accuracy at low cost.

Second Exemplary Embodiment

Figure 5:
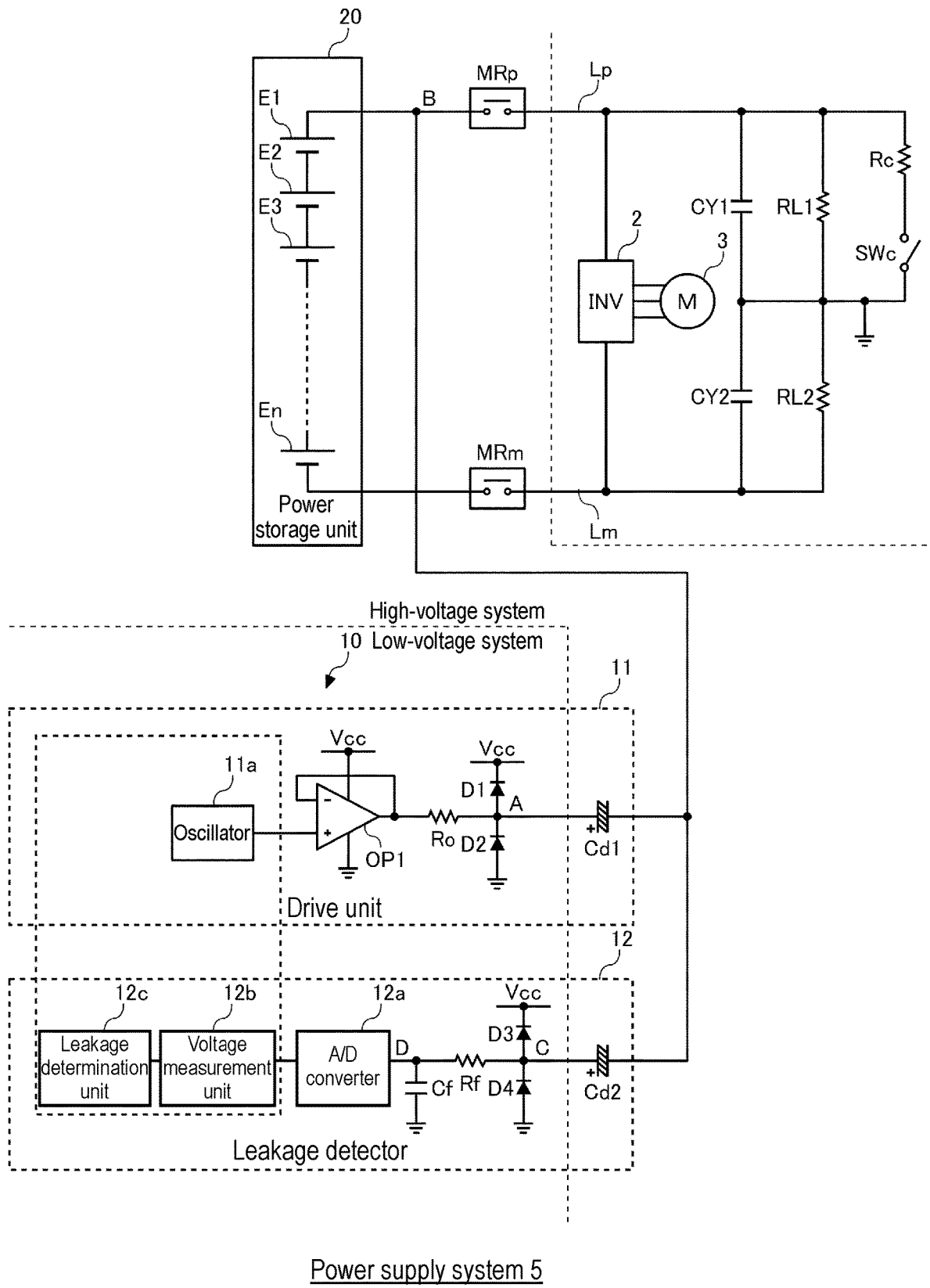
FIG. 5 is a diagram for explaining a configuration of a power supply system including a leakage detecting device according to a second exemplary embodiment.

FIG. 5 is a diagram for explaining a configuration of power supply system 5 including leakage detecting device 10 according to a second exemplary embodiment. Hereinafter, differences from leakage detecting device 10 according to the first exemplary embodiment illustrated in FIG. 1 will be described. In the second exemplary embodiment, adjustment resistor Rc and adjustment switch Rc are connected in series in parallel with first Y capacitor CY1 between positive power supply line Lp and the chassis earth. Note that adjustment resistor Rc and adjustment switch Rc may be connected between negative power supply line Lm and the chassis earth.

In the following calculation formula, the parallel resistance value of first leakage resistor RL1, second leakage resistor RL2, and adjustment resistor Rc is expressed as RL'. In the circuit illustrated in FIG. 5, time constant T1 at point B when adjustment switch SWc is turned off is defined as the following (Formula 4). Input voltage Vin at point D when adjustment switch SWc is turned off is defined as the following (Formula 5). Time constant τ2 at point B when adjustment switch SWc is turned on is defined as the following (Formula 6). Input voltage Vin at point D when adjustment switch SWc is turned on is defined as the following (Formula 7).

$$\tau 1 = RL \times (CY + Cd) \quad \text{(Formula 4)}$$

$$Vin = E \times Cd/(Cd+CY) \times e^{-t/\tau} \quad \text{(Formula 5)}$$

$$\tau 2 = RL' \times (CY + Cd) \quad \text{(Formula 6)}$$

$$Vin = E \times Cd/(Cd+CY) \times e^{-t/\tau 2} \quad \text{(Formula 7)}$$

Electrical leakage determination unit 12c measures time t at which $Vin = E \times Cd/(Cd+CY) \times e^{-a}$. Time t1 when adjustment switch SWc is off is defined as the following (Formula 8), and time t2 when adjustment switch SWc is on is defined as the following (Formula 9).

$$t1 = a\tau 1 = a \times (RL \times CY) \quad \text{(Formula 8)}$$

$$t2 = a\tau 2 = a \times (RL' \times CY) \quad \text{(Formula 9)}$$

Combined resistance RL' of leakage resistor RL and adjustment resistor Rc is defined as the following (Formula 10).

$$RL' = RL \times Rc/(RL+Rc) \quad \text{(Formula 10)}$$

From the above (Formula 8), (Formula 9), and (Formula 10), t2 can be rewritten as the following (Formula 11).

$$t2 = a \times RL' \times t1/(a \times RL) = t1 \times RL'/RL = t1 \times Rc/(RL+Rc) \quad \text{(Formula 11)}$$

When the above (Formula 11) is solved for RL, the following (Formula 12) can be defined.

$$RL = t1 \times Rc/t2 - Rc \quad \text{(Formula 12)}$$

As described above, in the second exemplary embodiment, leakage determination unit 12c measures time t1 at which $Vin = E \times Cd/(Cd+CY) \times e'$ when adjustment switch SWc is off and time t2 at which $Vin = E \times Cd/(Cd+CY) \times e'$ when adjustment switch SWc is on, and calculates the value of leakage resistor RL. Electrical leakage determination unit 12c compares the calculated value of leakage resistor RL with a resistance threshold, and determines that an electrical leakage has occurred when the calculated value of leakage resistor RL is less than or equal to the resistance threshold.

As shown in the above (Formula 12), according to the second exemplary embodiment, the influence of the variation of Y capacitor CY can also be removed from the calculated leakage resistor RL in addition to the influence of the variation of driving coupling capacitor Cd1. Accordingly, the detection accuracy of the electric leakage can be further enhanced.

Third Exemplary Embodiment

Figure 6:
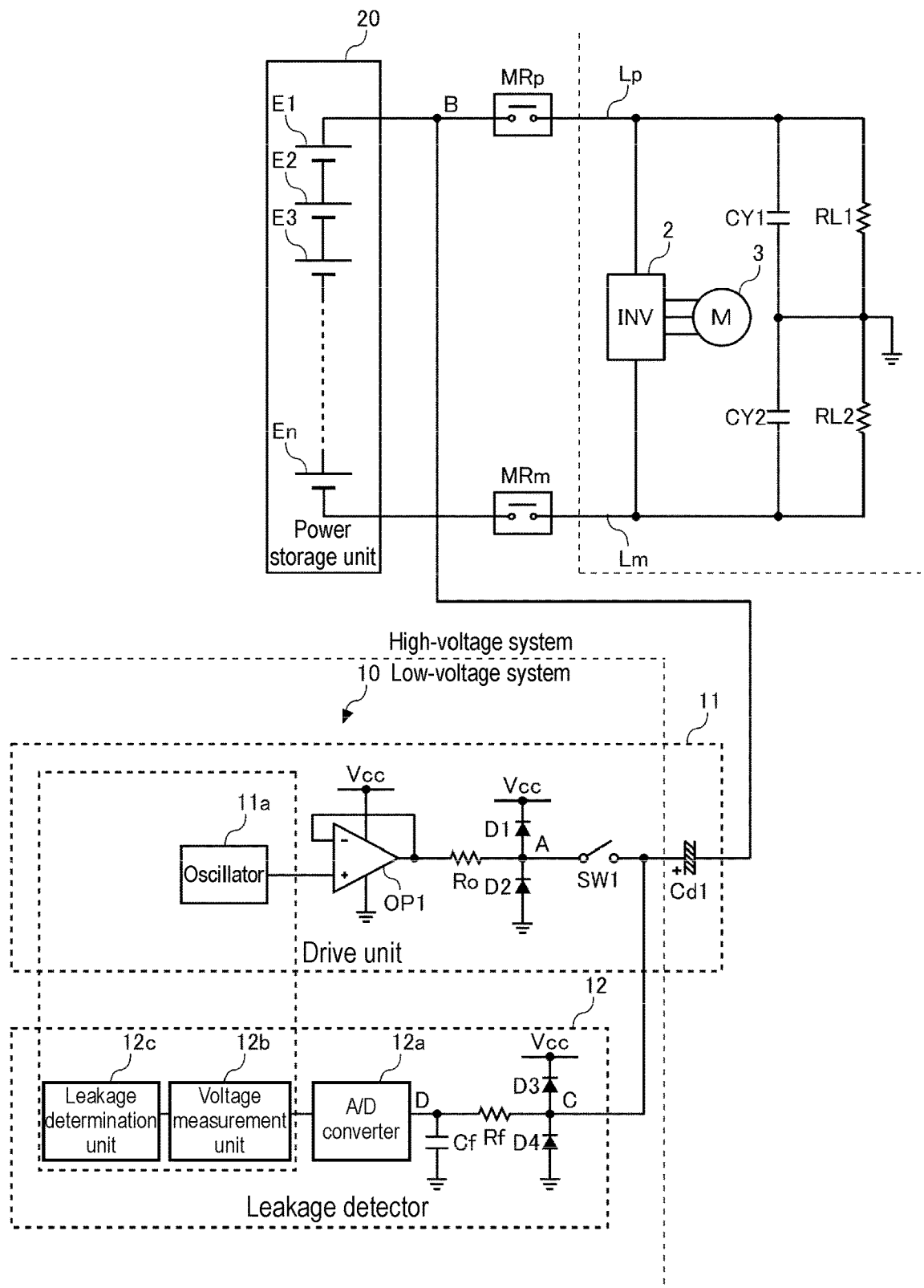
FIG. 6 is a diagram for explaining a configuration of a power supply system including a leakage detecting device according to a third exemplary embodiment.

FIG. 6 is a diagram for explaining a configuration of power supply system 5 including leakage detecting device 10 according to a third exemplary embodiment. Hereinafter, differences from leakage detecting device 10 according to the first exemplary embodiment illustrated in FIG. 1 will be described. In the third exemplary embodiment, switch SW1 is inserted between output resistor Ro and driving coupling capacitor Cd1. Measurement coupling capacitor Cd2 is not provided, and leakage detector 12 measures the voltage at point B via driving coupling capacitor Cd1 while switch SW1 is off.

Figure 7:
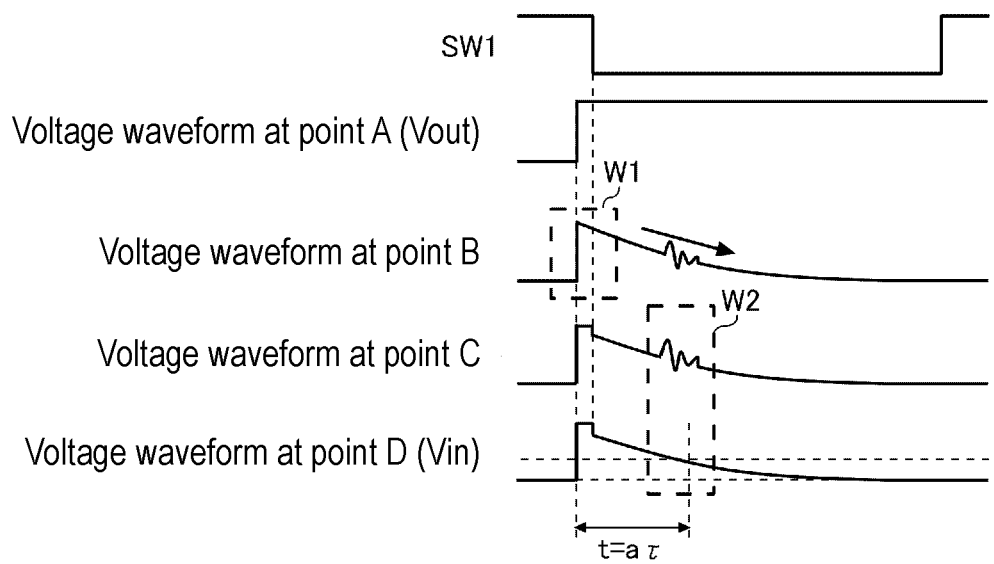
FIG. 7 is a diagram illustrating an example of a voltage waveform at each point at the time of electric leakage detection by the leakage detecting device according to the third exemplary embodiment.

FIG. 7 is a diagram illustrating an example of a voltage waveform at each point at the time of electric leakage detection by leakage detecting device 10 according to the third exemplary embodiment. When the voltage waveform at point A rises in the state where switch SW1 is on, charges are charged in Y capacitor CY, and the voltage at B rises due to an increase in the capacitance of Y capacitor CY (see W1). Thereafter, leakage detector 12 turns off switch SW1.

When switch SW1 is off, the voltage variation at point B is transmitted to point C via measurement coupling capacitor Cd2. The voltage waveform at point D is obtained by removing noise from the voltage waveform at point C by the low-pass filter (see W2). As the charge charged in Y capacitor CY escapes via leakage resistor RL, the voltage at point B gradually decreases and converges to the original voltage. Also in the third exemplary embodiment, the value of leakage resistor RL can be calculated as in the first exemplary embodiment.

As described above, according to the third exemplary embodiment, since measurement coupling capacitor Cd2 can be omitted, the cost and the circuit area can be reduced.

The present disclosure is described above according to the exemplary embodiments. It will be understood by those skilled in the art that the exemplary embodiments are merely an example, other modified examples in which configuration elements and processing processes of the exemplary embodiments are variously combined are possible, and the other modified examples still fall within the scope of the present disclosure.

For example, the second exemplary embodiment and the third exemplary embodiment may be combined. Specifically, in the circuit configuration of FIG. 6, adjustment resistor Rc and adjustment switch Rc may be connected in series between positive power supply line Lp and the chassis earth in parallel with first Y capacitor CY1. Note that adjustment resistor Rc and adjustment switch Rc may be connected between negative power supply line Lm and the chassis earth.

In the above embodiment, the charge is charged in Y capacitor CY by applying the rectangular wave voltage for charging from drive unit 11 to point B, and the electric leakage is detected based on the voltage transition (specifically, the change rate of the voltage) when the charge charged in Y capacitor CY is discharged through leakage resistor RL. In this regard, a discharging rectangular wave voltage may be applied from drive unit 11 to point B to discharge the charge from Y capacitor CY, and the electric leakage may be detected based on the voltage transition when the charge discharged from Y capacitor CY is charged via leakage resistor RL.

The above exemplary embodiment has been described as an example in which leakage detecting device 10 incorporated in an electric vehicle is used. leakage detecting device 10 according to the exemplary embodiment, however, may also be used in applications different from in-vehicle applications. In a configuration in which power storage unit 20 and a load supplied with power from power storage unit 20 are insulated from the earth, the load may be provided as any type of a load. For example, the load may be a load used in a railway vehicle.

Note that, the exemplary embodiments may be specified by the following Items.

[Item 1]

Leakage detecting device (10) that detects an electric leakage from a high-voltage unit in which power storage unit (20) and load (2) are connected by a power supply line (Lp, Lm) in a state of being insulated from an earth, in which Y capacitor (CY) is connected between a current path between power storage unit (20) and load (2) and the earth, leakage detecting device (10) including:
    drive unit (11) configured to output a rectangular wave voltage to the current path between power storage unit (20) and load (2) via driving coupling capacitor (Cd1) to charge or discharge Y capacitor (CY); and
    leakage detector (12) configured to determine presence or absence of a leakage between the current path and the earth according to a time transition in which a voltage at a measurement point of the current path changed according to charging or discharging of Y capacitor (CY) converges to an original voltage.

According to this, even when the capacitance of Y capacitor (CY) is large, the electric leakage can be detected with high accuracy at low cost.

[Item 2]

Leakage detecting device (10) according to Item 1, in which leakage detector (12) calculates a leakage resistance value between the current path and the earth based on the time transition of the voltage at the measurement point after Y capacitor (CY) is charged or discharged, and determines that the electric leakage occurs between the current path and the earth when the calculated leakage resistance value is less than or equal to a threshold.

Accordingly, the influence of driving coupling capacitor (Cd1) can be removed from the leakage resistance value to be calculated.

[Item 3]

Leakage detecting device (10) according to Item 1 or 2, in which leakage detector (12) measures the voltage at the measurement point of the current path via measurement coupling capacitor (Cd2).

According to this, the time transition of the voltage fluctuation in the current path can be measured.

[Item 4]

Leakage detecting device (10) according to Item 1 or 2, in which
    drive unit (11) includes:
    oscillator (11a) configured to output the rectangular wave voltage;
    output resistor (Ro) connected to an output of oscillator (11a); and
    switch (SW1) inserted between output resistor (Ro) and driving coupling capacitor (Cd1), and
    leakage detector (12) includes voltage measurement unit (12b) that measures the voltage at the measurement point of the current path via driving coupling capacitor (Cd1) while switch (SW1) is off.

According to this, the coupling capacitor (Cd2) for measurement can be omitted.

[Item 5]

Leakage detecting device (10) according to any one of Items 1 to 4, in which
    adjustment resistor (Rc) and adjustment switch (SWc) are connected in series between the current path and the earth in parallel with Y capacitor (CY), and
    leakage detector (12) calculates a leakage resistance value between the current path and the earth based on a voltage at a measurement point of the current path during an ON period and an OFF period of adjustment switch (SWc).

Accordingly, the influence of Y capacitor (CY) can be removed from the calculated leakage resistance value.

[Item 6]

Vehicle power supply system (5) including:
    power storage unit (20) that is mounted in a state of being insulated from a chassis earth of a vehicle, and supplies power to load (2) in the vehicle; and
    leakage detecting device (10) according to any one of Items 1 to 5.

According to this, it is possible to realize vehicle power supply system (5) including leakage detecting device (10) capable of detecting an electric leakage with high accuracy at low cost even when the capacitance of Y capacitor (CY) is large.

REFERENCE MARKS IN THE DRAWINGS

5: power supply system
20: power storage unit
2: inverter
3: motor
Lp: positive power supply line
Lm: negative power supply line
CY: Y capacitor
Cd1: driving coupling capacitor
Cd2: measurement coupling capacitor
Cf: capacitor
RL: leakage resistance
Ro: output resistor
Rf: resistor
MRp: positive-side main relay
MRm: negative-side main relay
E1-En: cell
10: leakage detecting device
11: drive unit
11a: oscillator
12: leakage detector
12a: A/D converter 12b: voltage measurement unit
12c: leakage determination unit
OP1: operational amplifier
SW1: switch
SWc: adjustment switch
Rc: adjustment resistor
D1-D4: protection diode

The invention claimed is:

1. A leakage detecting device that detects an electric leakage from a high-voltage unit in which a power storage unit and a load are connected by a power supply line in a state of being insulated from an earth, wherein
a Y capacitor is connected between (i) a current path between the power storage unit and the load and (ii) the earth,
the leakage detecting device comprising:
a driving coupling capacitor and a measurement coupling capacitor having a node therebetween connected to a measurement point of the current path between the power storage unit and the load;
a drive unit configured to output a rectangular wave voltage to the current path between the power storage unit and the load via the driving coupling capacitor to charge or discharge the Y capacitor; and
a leakage detector configured to determine whether a leakage occurs between the current path and the earth according to a time transition in which a voltage at a measurement point of the current path changed according to charging or discharging of the Y capacitor converges to an original voltage,
wherein the leakage detector is configured to measure the voltage at the measurement point of the current path via the measurement coupling capacitor.

2. The leakage detecting device according to claim 1, wherein the leakage detector calculates a leakage resistance value between the current path and the earth based on the time transition of the voltage at the measurement point after the Y capacitor is charged or discharged, and determines that the electric leakage occurs between the current path and the earth when the calculated leakage resistance value is less than or equal to a threshold.

3. The leakage detecting device according to claim 1, wherein
an adjustment resistor and an adjustment switch are connected in series between the current path and the earth in parallel with a Y capacitor, and
the leakage detector calculates a leakage resistance value between the current path and the earth based on voltages at a measurement point of the current path during an ON period and an OFF period of the adjustment switch.

4. A vehicle power supply system comprising:
the leakage detecting device according to claim 1; and
the power storage unit that is mounted in a state of being insulated from the chassis earth of the vehicle, and supplies power to the load in the vehicle.

5. A leakage detecting device that detects an electric leakage from a high-voltage unit in which a power storage unit and a load are connected by a power supply line in a state of being insulated from an earth, wherein
a Y capacitor is connected between (i) a current path between the power storage unit and the load and (ii) the earth,
the leakage detecting device comprising:
a drive unit configured to output a rectangular wave voltage to the current path between the power storage unit and the load via a driving coupling capacitor to charge or discharge the Y capacitor; and
a leakage detector configured to determine whether a leakage occurs between the current path and the earth according to a time transition in which a voltage at a measurement point of the current path changed according to charging or discharging of the Y capacitor converges to an original voltage,
wherein the drive unit includes:
an oscillator configured to output the rectangular wave voltage;
an output resistor connected to an output of the oscillator; and
a switch inserted between the output resistor and the driving coupling capacitor, and
the leakage detector includes a voltage measurement unit that measures the voltage at the measurement point of the current path via the driving coupling capacitor while the switch is off.

6. The leakage detecting device according to claim 5, wherein the leakage detector calculates a leakage resistance value between the current path and the earth based on the time transition of the voltage at the measurement point after the Y capacitor is charged or discharged, and determines that the electric leakage occurs between the current path and the earth when the calculated leakage resistance value is less than or equal to a threshold.

7. The leakage detecting device according to claim 5, wherein
an adjustment resistor and an adjustment switch are connected in series between the current path and the earth in parallel with a Y capacitor, and
the leakage detector calculates a leakage resistance value between the current path and the earth based on voltages at a measurement point of the current path during an ON period and an OFF period of the adjustment switch.

8. A vehicle power supply system comprising:
the leakage detecting device according to claim 5; and
the power storage unit that is mounted in a state of being insulated from the chassis earth of the vehicle, and supplies power to the load in the vehicle.

9. A leakage detecting device that detects an electric leakage from a high-voltage unit in which a power storage unit and a load are connected by a power supply line in a state of being insulated from an earth, wherein
a Y capacitor is connected between (i) a current path between the power storage unit and the load and (ii) the earth,
the leakage detecting device comprising:
a drive unit configured to output a rectangular wave voltage to the current path between the power storage unit and the load via a driving coupling capacitor to charge or discharge the Y capacitor; and
a leakage detector configured to determine whether a leakage occurs between the current path and the earth according to a time transition in which a voltage at a measurement point of the current path changed according to charging or discharging of the Y capacitor converges to an original voltage,
wherein an adjustment resistor and an adjustment switch are connected in series between the current path and the earth in parallel with a Y capacitor, and
the leakage detector calculates a leakage resistance value between the current path and the earth based on voltages at a measurement point of the current path during an ON period and an OFF period of the adjustment switch.

10. The leakage detecting device according to claim 9, wherein the leakage detector calculates a leakage resistance value between the current path and the earth based on the time transition of the voltage at the measurement point after the Y capacitor is charged or discharged, and determines that the electric leakage occurs between the current path and the earth when the calculated leakage resistance value is less than or equal to a threshold.

11. The leakage detecting device according to claim 9, wherein the leakage detector measures the voltage at the measurement point of the current path via a measurement coupling capacitor.

12. A vehicle power supply system comprising:
the leakage detecting device according to claim 11; and
the power storage unit that is mounted in a state of being insulated from the chassis earth of the vehicle, and supplies power to the load in the vehicle.

* * * * *